(12) United States Patent
Wang et al.

(10) Patent No.: US 7,109,765 B1
(45) Date of Patent: *Sep. 19, 2006

(54) PROGRAMMABLE PHASE SHIFT CIRCUITRY

(75) Inventors: Bonnie I Wang, Cupertino, CA (US); Joseph Huang, San Jose, CA (US); Chiakang Sung, Milpitas, CA (US); Xiaobao Wang, Santa Clara, CA (US); In Whan Kim, San Jose, CA (US); Wayne Yeung, San Francisco, CA (US); Khai Nguyen, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/996,186

(22) Filed: Nov. 22, 2004

Related U.S. Application Data

(60) Continuation of application No. 10/702,300, filed on Nov. 5, 2003, now Pat. No. 6,836,164, which is a division of application No. 10/056,787, filed on Jan. 23, 2002, now Pat. No. 6,667,641, which is a continuation of application No. 09/432,142, filed on Nov. 2, 1999, now Pat. No. 6,369,624.

(60) Provisional application No. 60/106,876, filed on Nov. 3, 1998, provisional application No. 60/107,101, filed on Nov. 4, 1998, provisional application No. 60/107,166, filed on Nov. 5, 1998.

(51) Int. Cl.
*H03L 7/06* (2006.01)

(52) U.S. Cl. .................. 327/156; 327/147; 327/150; 327/159; 331/25

(58) Field of Classification Search ........ 327/144–148, 327/150–159; 331/14, 25, 57, 60
See application file for complete search history.

(56) References Cited

U.S. PATENT DOCUMENTS

| | | | |
|---|---|---|---|
| 4,512,030 A | | 4/1985 | Fukuta |
| 4,687,949 A | * | 8/1987 | Yasuda .................. 327/382 |
| 4,759,043 A | | 7/1988 | Lewis |
| 5,059,924 A | | 10/1991 | JenningsCheck |
| 5,170,297 A | | 12/1992 | Wahler et al. |
| 5,185,581 A | | 2/1993 | Brown |
| 5,298,866 A | | 3/1994 | Kaplinsky |
| 5,428,317 A | | 6/1995 | Sanchez et al. |
| 5,451,912 A | | 9/1995 | Torode |
| 5,559,844 A | | 9/1996 | Lee |
| 5,561,692 A | | 10/1996 | Maitland et al. |
| 5,600,271 A | | 2/1997 | Erickson et al. |

(Continued)

OTHER PUBLICATIONS

Wolaver, Dan H., *Phase-Locked Loop Circuit Design*, PTR Prentice Hall, Englewood Cliffs, New Jersey, 1991, pp. 68-70.

(Continued)

*Primary Examiner*—Timothy P. Callahan
*Assistant Examiner*—An T. Luu
(74) *Attorney, Agent, or Firm*—Fish & Neave IP Group of Ropes & Gray LLP; Jeffrey H. Ingerman; Chia-Hao La

(57) ABSTRACT

A circuit provides a programmable phase shift feature, where the phase shift is programmably selectable by a user. This circuitry may be incorporated in a programmable logic device (PLD) or field programmable gate array (FPGA) to provide additional programmability features. The programmable phase shift circuitry may be implemented within a phase locked loop (PLL) or delay locked loop (DLL) circuit.

12 Claims, 17 Drawing Sheets

U.S. PATENT DOCUMENTS

| | | |
|---|---|---|
| 5,631,920 A | 5/1997 | Hardin |
| 5,635,879 A | 6/1997 | Sutardja et al. |
| 5,642,082 A | 6/1997 | Jefferson |
| 5,699,020 A | 12/1997 | Jefferson |
| 5,701,270 A | 12/1997 | Rao |
| 5,731,743 A | 3/1998 | Sauer |
| 5,744,991 A | 4/1998 | Jefferson et al. |
| 5,783,971 A | 7/1998 | Dekker |
| 5,864,258 A | 1/1999 | Cusinato et al. |
| 5,889,436 A | 3/1999 | Yeung et al. |
| 5,896,346 A | 4/1999 | Dell et al. |
| 5,946,268 A * | 8/1999 | Iwamoto et al. ............ 365/233 |
| 5,963,069 A | 10/1999 | Jefferson et al. |
| 5,963,074 A * | 10/1999 | Arkin ........................ 327/276 |
| 5,970,110 A | 10/1999 | Li |
| 6,100,735 A | 8/2000 | Lu |
| 6,114,915 A | 9/2000 | Huang et al. |
| 6,208,182 B1 | 3/2001 | Marbot et al. |
| 6,326,812 B1 | 12/2001 | Jefferson |
| 6,329,850 B1 | 12/2001 | Mair et al. |
| 6,359,814 B1 | 3/2002 | Sundaram et al. |
| 6,667,641 B1 * | 12/2003 | Wang et al. ................. 327/156 |
| 6,836,164 B1 * | 12/2004 | Wang et al. ................. 327/156 |

OTHER PUBLICATIONS

"ORCA® OR3Cxx (5 V) and OR3Txxx (3.3 V) Series Field-Programmable Gate Arrays," Lucent Technologies Microelectronics Group, Preliminary Data Sheet, Nov. 1997.

* cited by examiner

PROGRAMMABLE PHASE SHIFT CIRCUITRY

This application is a continuation of U.S. patent application Ser. No. 10/702,300, filed Nov. 5, 2003, now U.S. Pat. No. 6,836,164 which is a division of U.S. patent application Ser. No. 10/056,787, filed Jan. 23, 2002, now U.S. Pat. No. 6,667,641 which is a continuation of U.S. patent application Ser. No. 09/432,142, filed Nov. 2, 1999, now U.S. Pat. No. 6,369,624 which claims the benefit of U.S. provisional application 60/106,876, filed Nov. 3, 1998, 60/107,101, filed Nov. 4, 1998, and 60/107,166, filed Nov. 5, 1998, which are incorporated by reference along with all references cited in this application.

BACKGROUND OF THE INVENTION

The present invention relates to the field of electronic circuits, and in particular, programmable phase shift circuitry.

Many electronic systems use a master clock signal to synchronize the operation of all the circuitry and integrated circuit. A fundamental concept in electronic design, synchronous operation is important to ensure that logic operations are being performed correctly. In a system, an integrated circuit may generate its own internal clock based on the master clock signal. For example, this integrated circuit may be a microprocessor, ASIC, PLD, FPGA, or memory. The internal clock is synchronized with the master clock. And in order to ensure proper operation, it is often important to reduce skew for the internal clock of the integrated circuit.

The integrated circuit may use an on-chip clock synchronization circuit such as a phase locked loop (PLL) or delay locked loop (DLL). The synchronization circuit locks or maintains a specific phase relationship between the master clock and the internal clock. When the system is started, it is desirable that the internal clock be locked to the master clock as rapidly as possible. Under some circumstances, such as when there is a wide frequency difference between the two clock, the locking time may be slow. This is because the locking time may be dependent on the slower of the two frequencies. A slower locking time is undesirable because it will take longer for the system to initialize before normal operation. Also, as the master clock varies, it will take longer for the clock synchronization circuit to track these variations.

Therefore, techniques and circuitry are needed to address this problem of clock synchronization circuitry with slow lock acquisition times. Further, it is desirable to provide programmable phase shift selection.

SUMMARY OF THE INVENTION

The invention provides a programmable phase shift feature for a phase locked loop (PLL) or delay locked loop (DLL) circuit. The phase shift may be adjusted with equal steps. Each step may be a fixed percentage of the clock period, and will be independent of supply voltage, temperature, and process parameters. Having an on-chip PLL or DLL is an important feature in programmable logic devices (PLDs). Users can use a PLL to improve circuit performance and generate clocks with different frequencies. The phase requirement for the output clock varies depending on the application. A very useful feature for users is the ability to tune the phase of the output clock, and for the result to be independent of process, temperature, and power supply.

In an embodiment, a voltage controlled oscillator (VCO) is implemented using a ring oscillator with approximately equal delay for each stage. Other circuit implementations for a VCO may also be used, including those well known to one of skill in the art. The delay is controlled by the voltage from charge pump The number of stages in the VCO is programmable. This programmability allows a wider frequency range for the VCO. As a higher frequency as specified, a fewer number of stages are needed.

In a specific embodiment, the outputs of the VCO stages are muxed together with a multiplexer MUX1. MUX1 is a programmable multiplexer controlled by configuration RAMs or other programmable elements. The output of MUX1 is fed back to the phase detector through a frequency divider. The output clock of the PLL is connected to stage A of the VCO. If the feedback is not muxed from stage A, the output clock will have a phase shift compared with the input clock, since the feedback must be in phase with the input clock. The amount of the phase shift is determined by the number of stages between A and the feedback.

For example, in the case where there are nine stages in the VCO, and the delay of each stage is $\Delta t$, then, half of output clock period will equal to nine $\Delta t$. If the feedback is connected with stage C, then the feedback is two $\Delta t$ behind the output clock. Therefore the output clock is ahead of the input clock by 1/9 of the period (9 $\Delta t$=1/2 period, 2 $\Delta t$=1/9 period).

By programming MUX1, a user can adjust the phase difference between the output clock and the input clock. This phase difference will be a fixed percentage of the output clock period, and will be independent of process, temperature, and power supply.

In another aspect of the invention, the invention is a phase frequency detector circuit to compare two clock signals and generate a number of outputs to indicate the phase difference between the two clock signals. This circuitry may be used in phase locked loop (PLL) or delay locked loop (DLL) circuit in order to maintain or lock a phase relationship between the two clock signals. In a PLL or DLL implementation, one of the clocks would be the reference clock or REFCLK, which the user supplies. The other clock is an internally generated clock or CLK that is fed back to the phase frequency detector circuit. In an embodiment, the phase frequency detector circuit has greater than three states. By having a greater numbers of states, the phase frequency detector will be able to generate a more rapidly. The DLL or PLL will have a faster lock acquisition time, even when there is a wide frequency range between the two clock signals. This phase frequency detector may be implemented with the programmable phase shift feature of the invention.

In an embodiment, a circuit of the invention includes a phase detector circuit receiving a reference clock signal, a charge pump connected to the phase detector circuit, and a voltage controlled oscillator connected to the charge pump. The voltage controlled oscillator generates a number of voltage controlled oscillator outputs. Further, the circuit includes a first multiplexer connected to the voltage controlled oscillator, where the first multiplexer selects one of the voltage controlled oscillator outputs as a first clock output. This first clock output may feed back to the phase detector circuit. In an alternative embodiment, the first clock output may used as a clock signal and routed to other circuitry.

Other objects, features, and advantages of the present invention will become apparent upon consideration of the following detailed description and the accompanying draw-

DETAILED DESCRIPTION OF THE INVENTION

Figure 1:
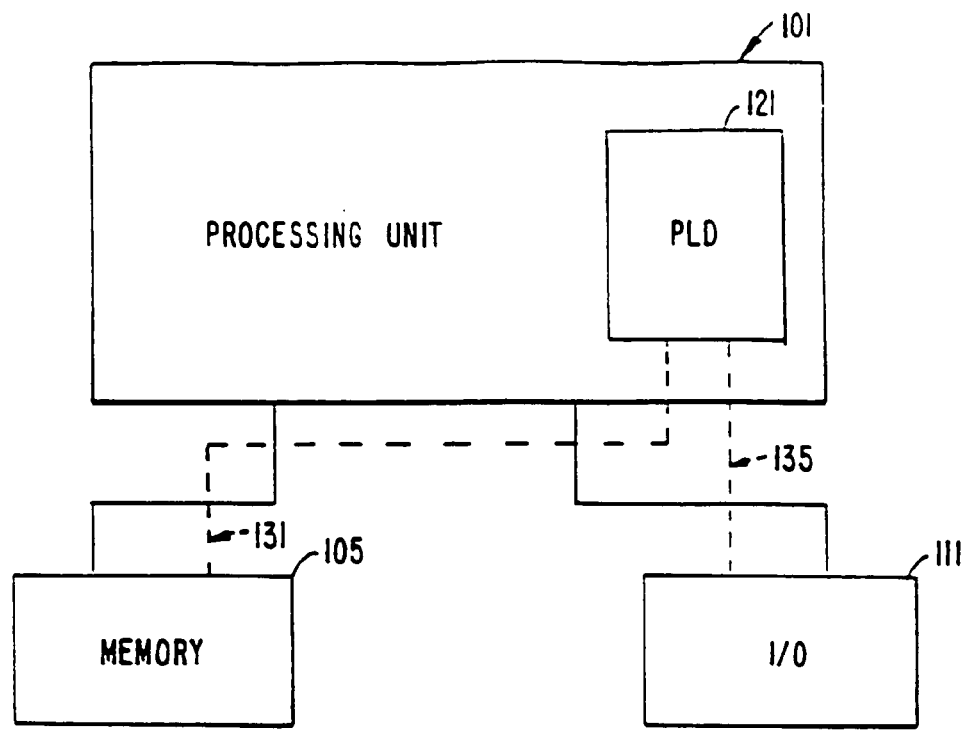
FIG. 1 is diagram of a digital system with a programmable logic integrated circuit.

FIG. 1 shows a block diagram of a digital system within which the present invention may be embodied. The system may be provided on a single board, on multiple boards, or even within multiple enclosures. FIG. 1 illustrates a system 101 in which a programmable logic device 121 may be utilized. Programmable logic devices are sometimes referred to as a PALs, PLAs, FPLAs, PLDs, CPLDs, EPLDs, EEPLDs, LCAs, or FPGAs and are well-known integrated circuits that provide the advantages of fixed integrated circuits with the flexibility of custom integrated circuits. Such devices allow a user to electrically program standard, off-the-shelf logic elements to meet a user's specific needs. See, for example, U.S. Pat. No. 4,617,479, incorporated by reference for all purposes. Programmable logic devices are currently represented by, for example, Altera's MAX®, FLEX®, and APEX™ series of PLDs. These are described in, for example, U.S. Pat. Nos. 4,871,930, 5,241,224, 5,258,668, 5,260,610, 5,260,611, 5,436,575, and the Altera Data Book (1999), all incorporated by reference in their entirety for all purposes. Programmable logic integrated circuits and their operation are well known to those of skill in the art.

In the particular embodiment of FIG. 1, a processing unit 101 is coupled to a memory 105 and an I/O 111 and incorporates a programmable logic device (PLD) 121. PLD 121 may be specially coupled to memory 105 through connection 131 and to I/O 111 through connection 135. The system may be a programmed digital computer system, digital signal processing system, specialized digital switching network, or other processing system. Moreover, such systems may be designed for a wide variety of applications such as, merely by way of example, telecommunications systems, automotive systems, control systems, consumer electronics, personal computers, and others.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, or other processing unit. Furthermore, in many embodiments, there is often no need for a CPU. For example, instead of a CPU, one or more PLDs 121 may control the logical operations of the system. In some embodiments, processing unit 101 may even be a computer system. Memory 105 may be a random access memory (RAM), read only memory (ROM), fixed or flexible disk media, PC Card flash disk memory, tape, or any other storage retrieval means, or any combination of these storage retrieval means. PLD 121 may serve many different purposes within the system in FIG. 1. PLD 121 may be a logical building block of processing unit 101, supporting its internal and external operations. PLD 121 is programmed to implement the logical functions necessary to carry on its particular role in system operation.

Figure 2:
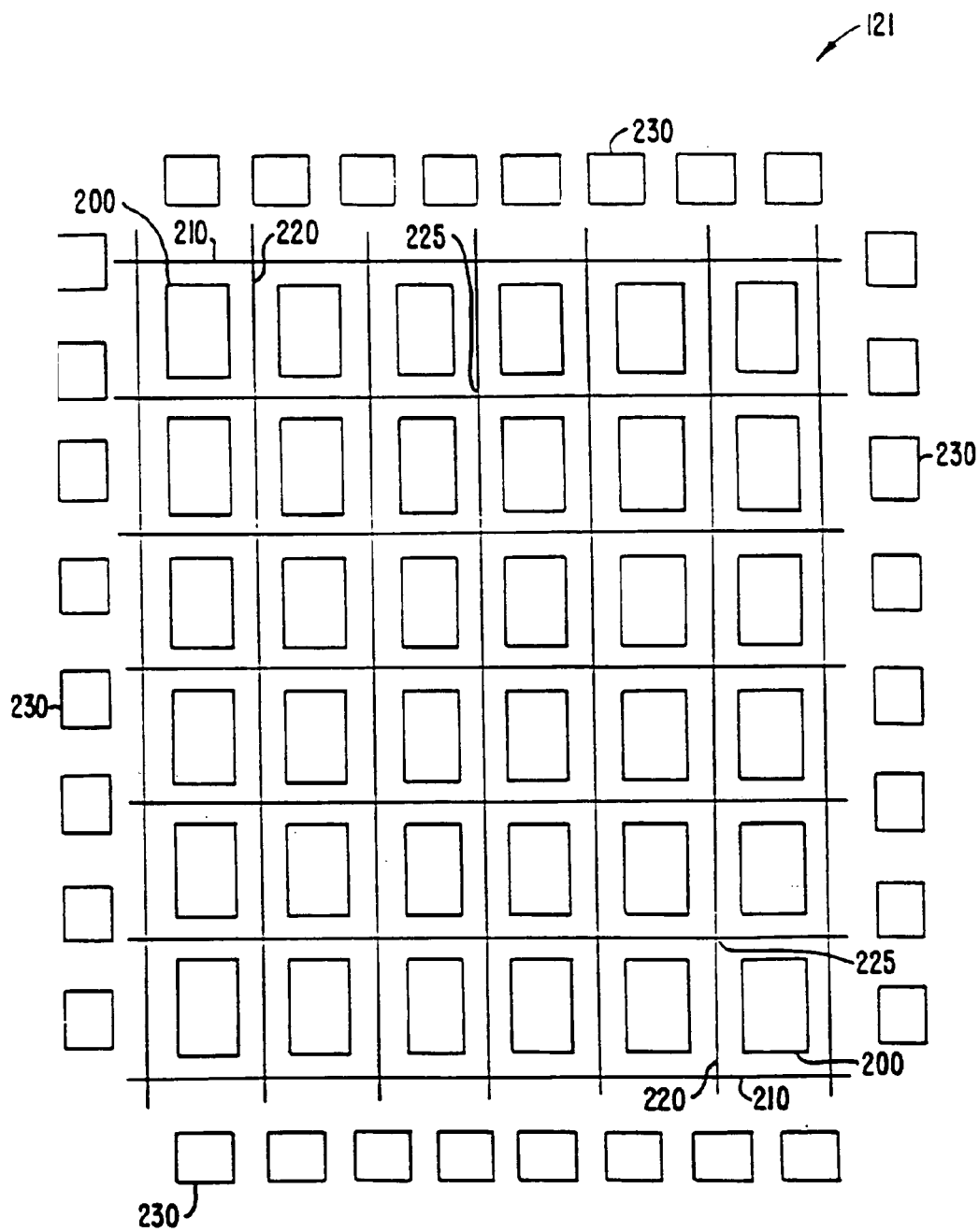
FIG. 2 is a diagram showing an architecture of a programmable logic integrated circuit.

FIG. 2 is a simplified block diagram of an overall internal architecture and organization of PLD 121 of FIG. 1. Many details of PLD architecture, organization, and circuit design are not necessary for an understanding of the present invention and such details are not shown in FIG. 2.

FIG. 2 shows a six-by-six two-dimensional array of thirty-six logic array blocks (LABs) 200. LAB 200 is a physically grouped set of logical resources that is configured or programmed to perform logical functions. The internal architecture of a LAB will be described in more detail below in connection with FIG. 3. PLDs may contain any arbitrary number of LABs, more or less than shown in PLD 121 of FIG. 2. Generally, in the future, as technology advances and improves, programmable logic devices with greater numbers of logic array blocks will undoubtedly be created. Furthermore, LABs 200 need not be organized in a square matrix or array; for example, the array may be organized in a five-by-seven or a twenty-by-seventy matrix of LABs.

LAB 200 has inputs and outputs (not shown) which may or may not be programmably connected to a global interconnect structure, comprising an array of global horizontal interconnects (GHs) 210 and global vertical interconnects (GVs) 220. Although shown as single lines in FIG. 2, each GH 210 and GV 220 line may represent a plurality of signal conductors. The inputs and outputs of LAB 200 are programmably connectable to an adjacent GH 210 and an adjacent GV 220. Utilizing GH 210 and GV 220 interconnects, multiple LABs 200 may be connected and combined to implement larger, more complex logic functions than can be realized using a single LAB 200.

In one embodiment, GH 210 and GV 220 conductors may or may not be programmably connectable at intersections 225 of these conductors. Moreover, GH 210 and GV 220 conductors may make multiple connections to other GH 210 and GV 220 conductors. Various GH 210 and GV 220 conductors may be programmably connected together to create a signal path from a LAB 200 at one location on PLD 121 to another LAB 200 at another location on PLD 121. A signal may pass through a plurality of intersections 225. Furthermore, an output signal from one LAB 200 can be directed into the inputs of one or more LABs 200. Also, using the global interconnect, signals from a LAB 200 can be fed back into the same LAB 200. In specific embodiments of the present invention, only selected GH 210 conductors are programmably connectable to a selection of GV 220 conductors. Furthermore, in still further embodiments, GH 210 and GV 220 conductors may be specifically used for passing signal in a specific direction, such as input or output, but not both.

In other embodiments, the programmable logic integrated circuit may include special or segmented interconnect that is connected to a specific number of LABs and not necessarily an entire row or column of LABs. For example, the segmented interconnect may programmably connect two, three, four, five, or more LABS.

The PLD architecture in FIG. 2 further shows at the peripheries of the chip, input-output drivers 230. Input-output drivers 230 are for interfacing the PLD to external, off-chip circuitry. FIG. 2 shows thirty-two input-output drivers 230; however, a PLD may contain any number of input-output drivers, more or less than the number depicted. Each input-output driver 230 is configurable for use as an input driver, output driver, or bidirectional driver.

Figure 3:
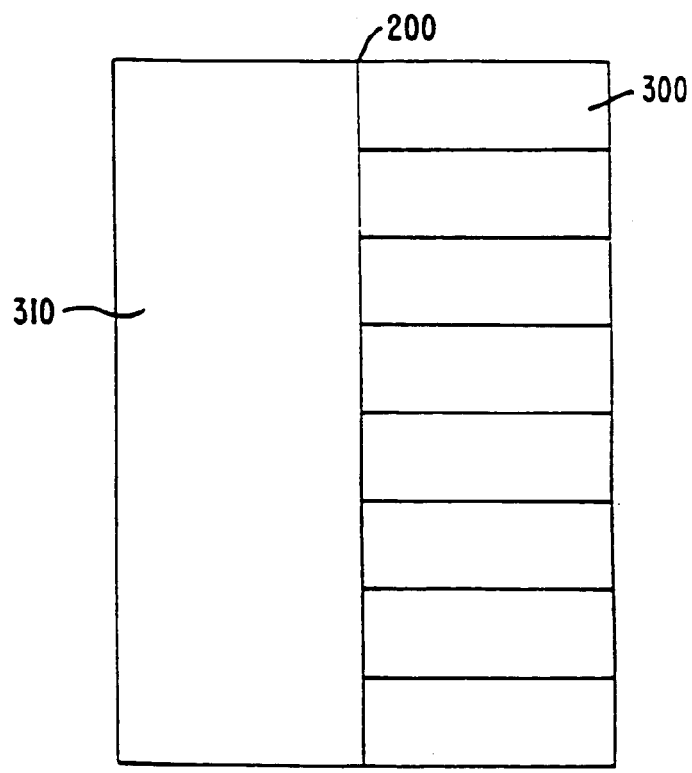
FIG. 3 is a simplified block diagram of a logic array block (LAB)

FIG. 3 shows a simplified block diagram of LAB 200 of FIG. 2. LAB 200 is comprised of a varying number of logic elements (LEs) 300, sometimes referred to as "logic cells," and a local (or internal) interconnect structure 310. LAB 200 has eight LEs 300, but LAB 200 may have any number of LEs, more or less than eight.

A general overview of LE 300 is presented here, sufficient to provide a basic understanding of the present invention. LE 300 is the smallest logical building block of a PLD. Signals external to the LAB, such as from GHs 210 and GVs 220, are programmably connected to LE 300 through local interconnect structure 310. In one embodiment, LE 300 of the present invention incorporates a function generator that is configurable to provide a logical function of a number of variables, such a four-variable Boolean operation. As well as combinatorial functions, LE 300 also provides support for sequential and registered functions using, for example, D flip-flops.

LE 300 provides combinatorial and registered outputs that are connectable to the GHs 210 and GVs 220, outside LAB 200. Furthermore, the outputs from LE 300 may be internally fed back into local interconnect structure 310; through local interconnect structure 310, an output from one LE 300 may be programmably connected to the inputs of other LEs 300, without using the global interconnect structure's GHs 210 and GVs 220. Local interconnect structure 310 allows short-distance interconnection of LEs, without utilizing the limited global resources, GHs 210 and GVs 220.

Figure 4A:
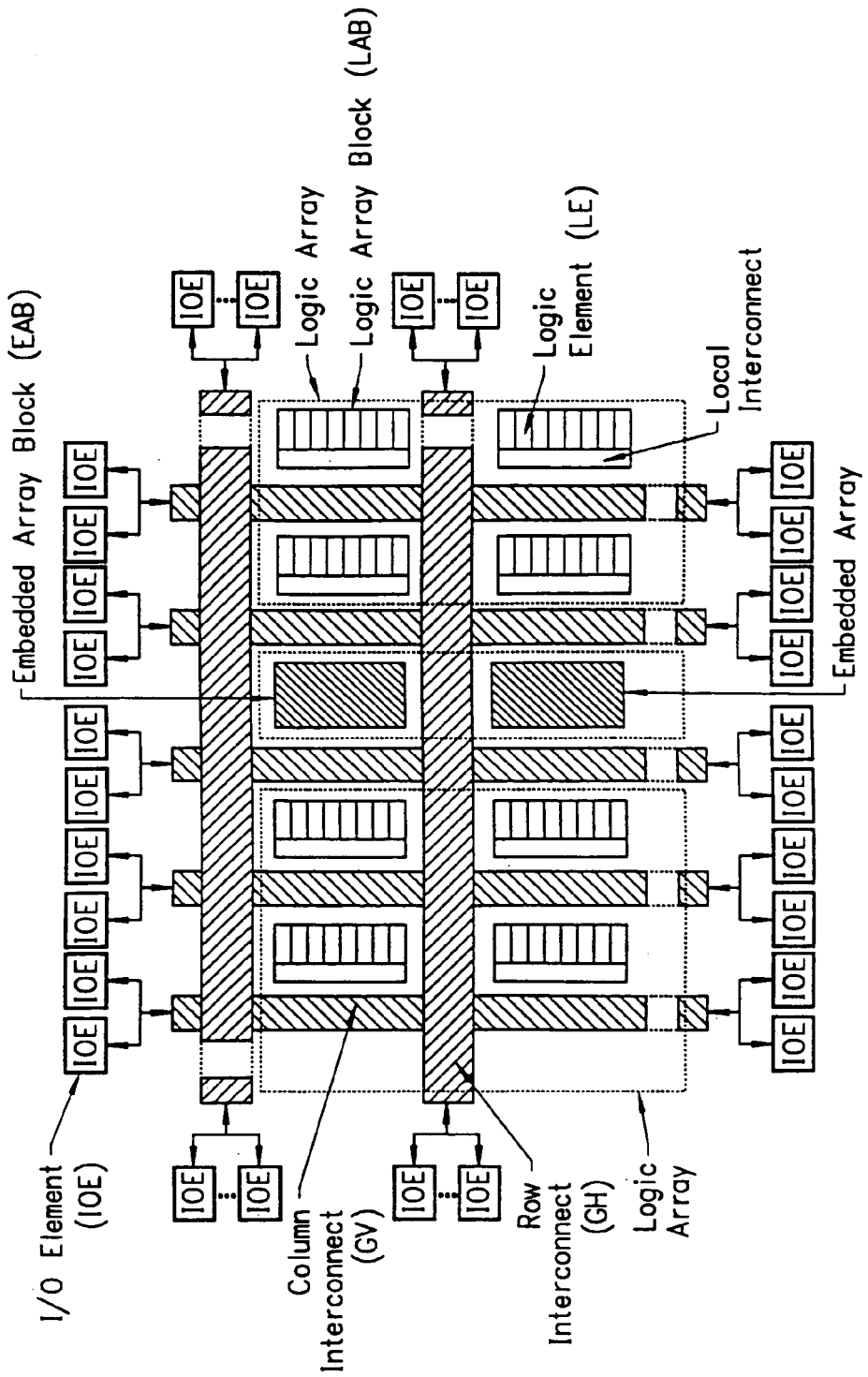
FIG. 4A shows an architecture of a programmable logic integrated circuit with embedded array blocks (EABs)

FIG. 4A shows a PLD architecture similar to that in FIG. 2. The architecture in FIG. 4A further includes embedded array blocks (EABs). EABs contain user memory, a flexible block of RAM. More discussion of this architecture may be found in the Altera Data Book (1999) in the description of the FLEX 10K product family and also in U.S. Pat. No. 5,550,782, which are incorporated by reference.

Figure 4B:
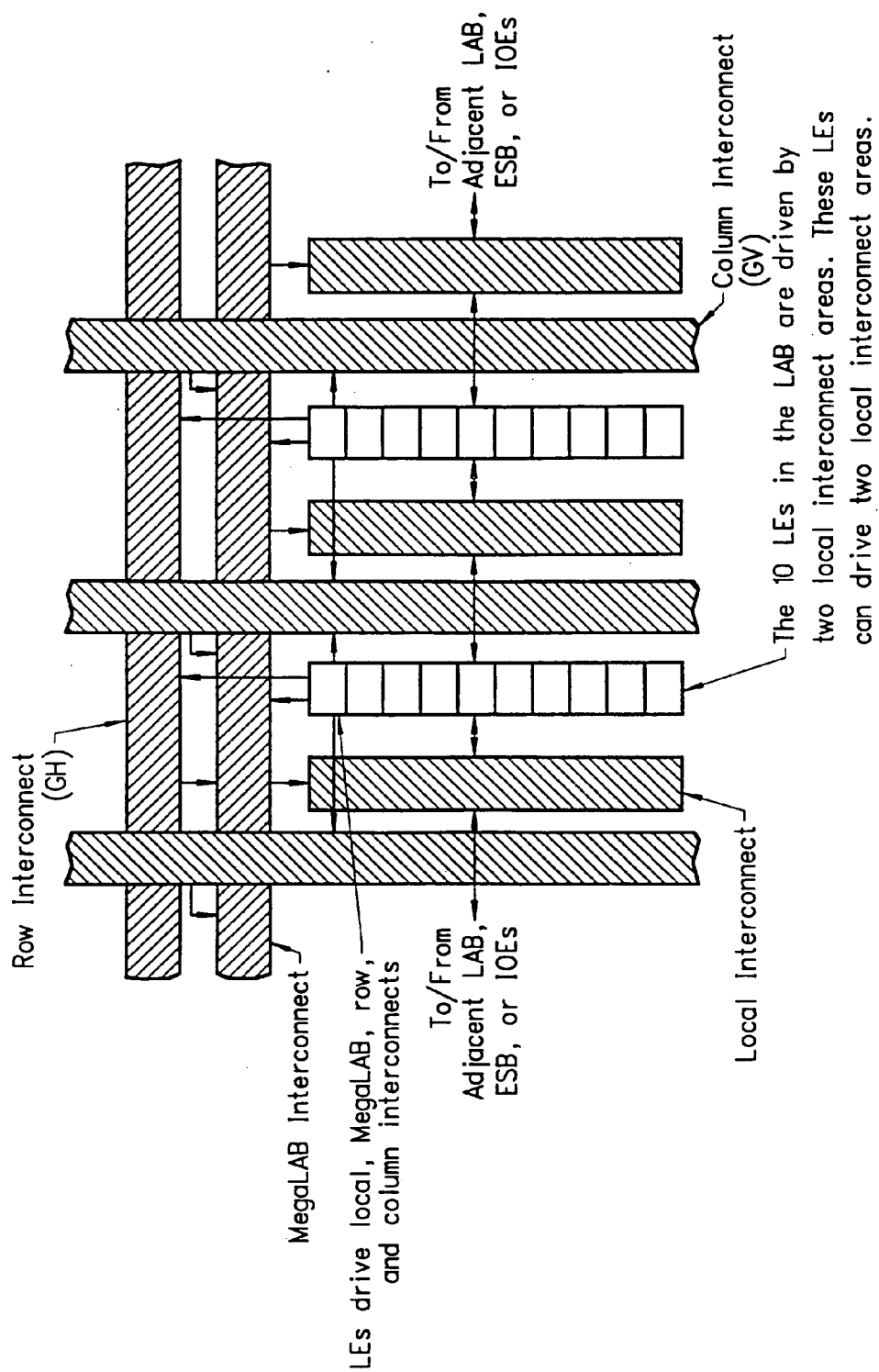
FIG. 4B shows an architecture of a programmable logic integrated circuit with megaLABs.

FIG. 4B shows a further embodiment of a programmable logic integrated circuit architecture. FIG. 4B only shows a portion of the architecture. The features shown in FIG. 4B are repeated horizontally and vertically as needed to create a PLD of any desired size. In this architecture, a number of LABs are grouped together into a megaLAB. In a specific embodiment, a megaLAB has sixteen LABs, each of which has ten LEs. There can be any number of megaLABs per PLD. A megaLAB is programmably connected using a megaLAB interconnect. This megaLAB interconnect may be considered another interconnect level that is between the global interconnect and local interconnect levels. The megaLAB interconnect can be programmably connected to GVs, GHs, and the local interconnect of each LAB of the megaLAB. Compared to the architecture of FIG. 2, this architecture has an additional level of interconnect, the megaLAB interconnect. Such an architecture is found in Altera's APEX™ family of products, which is described in detail in the APEX 20K Programmably Logic Device Family Data Sheet (August 1999), which is incorporated by reference. In a specific implementation, a megaLAB also includes an embedded system block (ESB) to implement a variety of memory functions such as CAM, RAM, dual-port RAM, ROM, and FIFO functions.

In an embodiment, the invention is a the PLD having a delay locked loop (DLL) or phase locked loop (PLL) circuit. DLL and PLL circuits are an important feature to minimize clock skew in such programmable integrated circuits as PLDs or FPGAs. A description of on-chip DLL and PLL circuitry for a PLD is discussed in U.S. Pat. No. 5,744,991, which is incorporated by reference. U.S. patent application Ser. No. 09/285,180, filed Mar. 23, 1999, discusses aspects of a programmable wide frequency synthesizer and is also incorporated by reference. The DLL or PLL circuitry of the PLD would include an m-state phase frequency detector circuit of the invention. In a specific case, m is an odd integer greater than three. For example, the phase detector of the invention may have five, seven, nine, eleven, thirteen, or more states. The invention is especially well suited for programmable logic integrated circuits because there may be a relatively large difference in frequencies between the reference clock and internally generated clock. A typical clock frequency range for a PLD is from about 1 megahertz to about 460 megahertz, or more. By using the m-state phase frequency detector of the invention, the circuitry will lock the phase more rapidly. The circuitry of the invention is also useful for other types of integrated circuit including microprocessors, microcontrollers, memories, DRAMs, and SRAMs.

Figure 5:
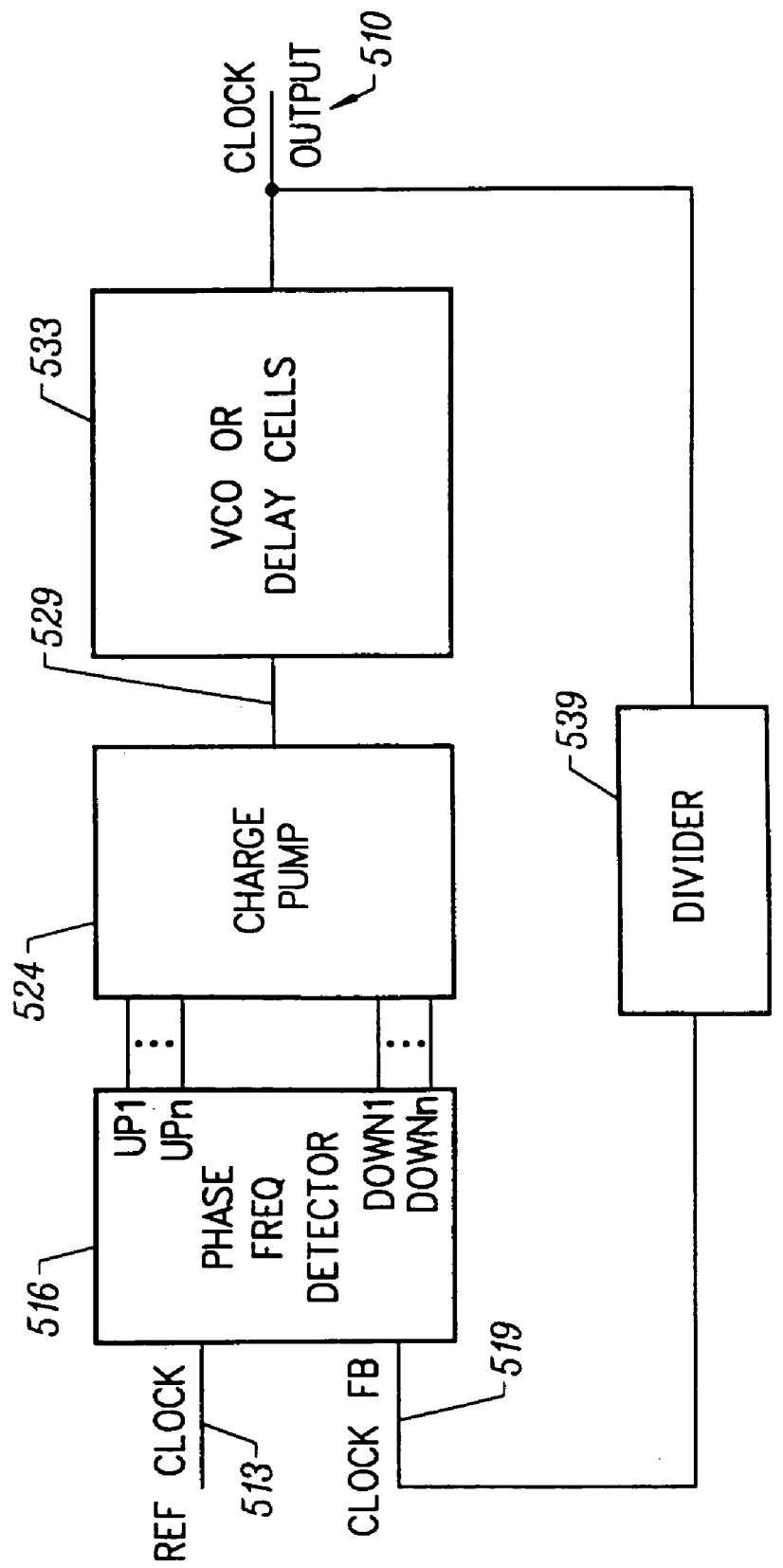
FIG. 5 shows a phase locked loop circuit.

FIG. 5 shows a phase locked loop circuit of the invention. A phase locked loop circuit is sometimes referred to as a PLL. The PLL is generally on an integrated circuit and takes as input a reference clock 513, usually from an external source. The phase locked loop circuit generates a clock output 510 that is maintained or locked in a particular phase relationship with reference clock 513. In a typical case, the clock output will be in phase with an edge of the reference clock. The clock output can also be placed in any phase relationship-such as 20 degrees out-of-phase, 60 degrees output-of-phase, 90 degrees output-of-phase, −45 degrees output-of-phase, and so forth-with respect to the reference clock. The phase relationship between the reference clock and clock output may be selected by the design or can be user specified.

In a programmable logic integrated circuit, the clock output would be programmably connectable to the logic array blocks, embedded array blocks, configurable logic blocks, and other logical elements. The PLL will distribute clock signals with no or reduced skew. This is especially important for larger integrated circuits because there are more logical elements and the interconnections are usually longer. The programmable logic integrated circuit may have more than one PLL circuit to support multiple clock signals. In a specific embodiment, a programmable logic integrated circuit having an architecture such as shown in FIG. 4A has six independent PLL circuits. Four of these PLL circuits can be TTL PLLs, where the reference clock signal is provided using TTL input levels. The other two PLLs are low voltage differential signal (LVDS) PLLs, where the reference clock is provided using LVDS input levels.

In FIG. 5, the PLL includes a phase frequency detector (PFD) 516, which receives and compares the reference clock and a clock feedback 519. Based on this comparison, the phase frequency detector outputs UP1 to UPn signals and DOWN1 to DOWNn signals to a charge pump circuit 524. For example, when the reference clock leads the feedback clock, an UP pulse is generated. When the feedback clock leads the reference clock, a DOWN pulse is generated. Based on the UP and DOWN signals, the charge pump circuit outputs a control signal 529 to adjust a voltage controlled oscillator (VCO) 533 to maintain or lock a phase relationship between the clock output and the reference clock. The VCO may be implemented using delay cells. The delay cells may be constructed using a number of buffers or inverters connected in a ring oscillator arrangement. By adjusting the control signal, the frequency of the VCO clock output 510 is adjusted. By changing the frequency, this also adjusts the phase. The clock output is fed back through a divider circuit 539, which generates clock feedback 519, to the phase frequency detector. In an embodiment, the divider circuit divides the frequency of the clock output by an amount from 1 to about 256.

The phase frequency detector is an m-state phase detector, where there will be (m−1)/2 UP and (m−1)/2 DOWN signals. For example, a three-state phase detector will have an UP and DOWN signal. A five-state phase detector will have UP1, UP2, DOWN1, and DOWN2 signals. A seven-state phase detector will have three UP and three DOWN signals. The UP signal is a pulse to adjust the charge pump in a first direction, and the DOWN signal is a pulse to adjust the charge pump in a second direction. The first direction is usually the opposite of the second direction. For example, the UP pulse may adjust the phase of the VCO output clock in a positive direction in relation to the reference clock edge, and the DOWN will adjust the VCC output clock in a negative direction. By providing a series of UP and DOWN signals, the phase relationship between the clock and reference clock is maintained.

An m-state phase frequency detector of the invention may also be used in a DLL circuit. The phase frequency detector could be incorporated into a DLL circuit in a similar fashion as it is incorporated into a PLL circuit. The techniques and circuitry of the invention can be applied to phase detector circuits and frequency detector circuits.

The PLL circuitry of the invention will lock more quickly because the phase frequency detector reacts more quickly to phase differences by generating UP and DOWN signals more frequently. A three-state phase detector circuit is slower than similar circuitry having five or more states because the circuitry must reset to the initial state before there can be a pulse. A five-state phase frequency detector will lock at least as quickly as a three-state phase frequency detector. In the typical case, a five-state phase detector will lock or align the phase of the clock about twice as fast as a three-state phase detector. For a clock frequency range from 1 megahertz to 460 megahertz, the five-state phase frequency detector will lock the phase up to twice as fast as a three-state phase detector. A five-state phase frequency detector generates two pulses for every one pulse of a three-state phase frequency detector. It will generally take longer for the PLL circuitry to lock at lower frequencies because the circuitry is operating more slowly. At lower frequencies, a five-state phase detector will be faster than a three-state phase detector.

Figure 6:
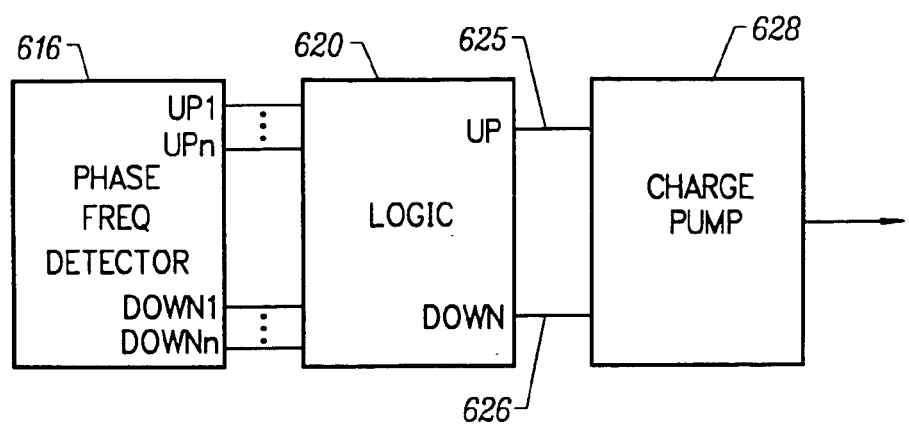
FIG. 6 shows a portion of another implementation of a the phase locked loop circuit.

For an m-state phase detector, where m is greater than three, the UP1 to UPn signals can be combined and treated as a single UP signal by the charge pump. And, the DOWN1 to DOWNn signals are combined and treated as a single DOWN signal by the charge pump. As shown in FIG. 6, there is logic 620 to combine the UPn and DOWNn signals into a single UP signal 625 and DOWN signal 626. The UP and DOWN signals will be input to the charge pump 628. By using logic 620, similar charge pump circuitry as used for a three-state phase detector can be used for the m-state phase detector. The logic may be separate from the phase frequency detector circuitry, part of the phase frequency detector circuitry, or part of the charge pump circuitry.

Figure 7:
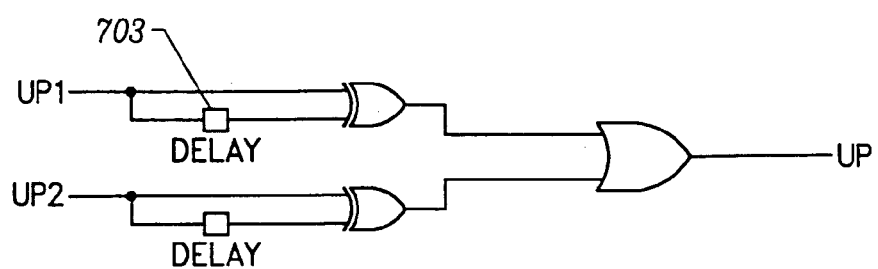
FIG. 7 shows circuitry to generate a single UP signal from UP1 and UP2 signals.

FIG. 7 shows circuitry than can be used to implement logic 620 for the UP signals. Similar circuitry can be used for the DOWN signals. UP1 and a delayed version of the UP1 (as a result of delay block 703) are input into an exclusive OR gate. Delay block 703 provides a delay from its input to its output. Delay block 703 may be implemented using a chain of inverters. There are many other techniques to implement a delay block in an integrated circuit, and any of these techniques may be used. The output of the XOR gate is input to an OR gate. There are similar XOR gate circuits for each of the n UP signals. The output of the OR gate is UP, which will pulse every time there is a pulse on any of the UP1 to UPn inputs. Delay 703 makes the pulse from the XOR gate have a constant width, which will be based on the length of the delay provided by delay block 703. To make the pulse widths from all the XOR gates the same, the length of delay 703 for each of the UP branches should be the same.

The figure shows only one implementation of the logic. As one of skill in logic design understands, there are many other ways to implement the same logical function using different types of gates and circuitry. For example, the circuitry may use pass gates, transmission gates, NAND gates, NOR gates, inverters, AND gates, and other gates in substitution for the XOR and OR gates shown.

Figure 8:
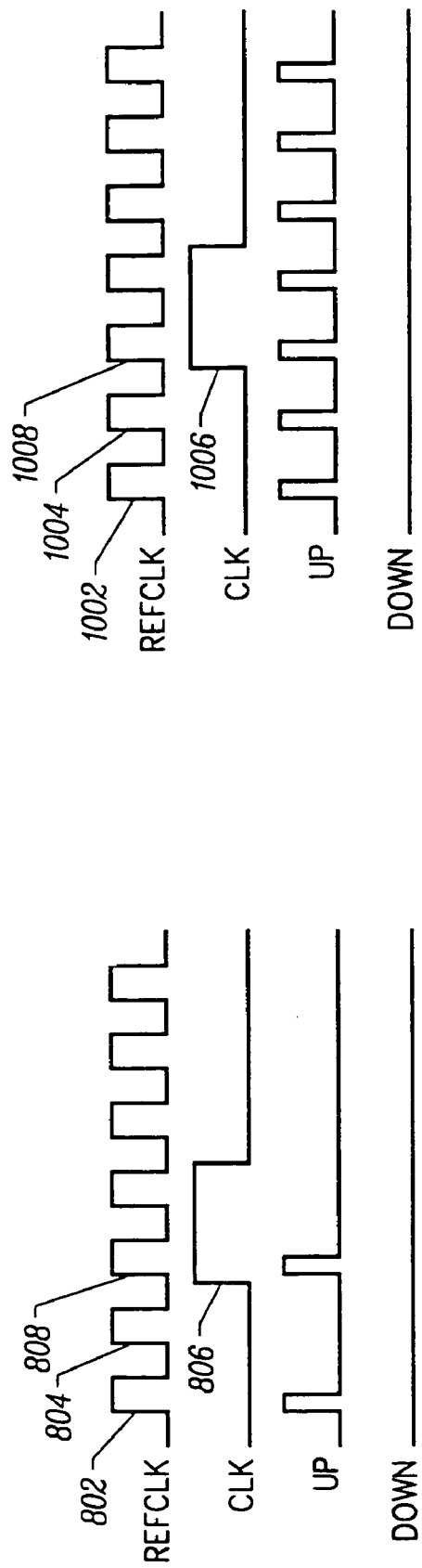
FIG. 8 shows a timing diagram for a three-state phase frequency detector.
Figure 9:
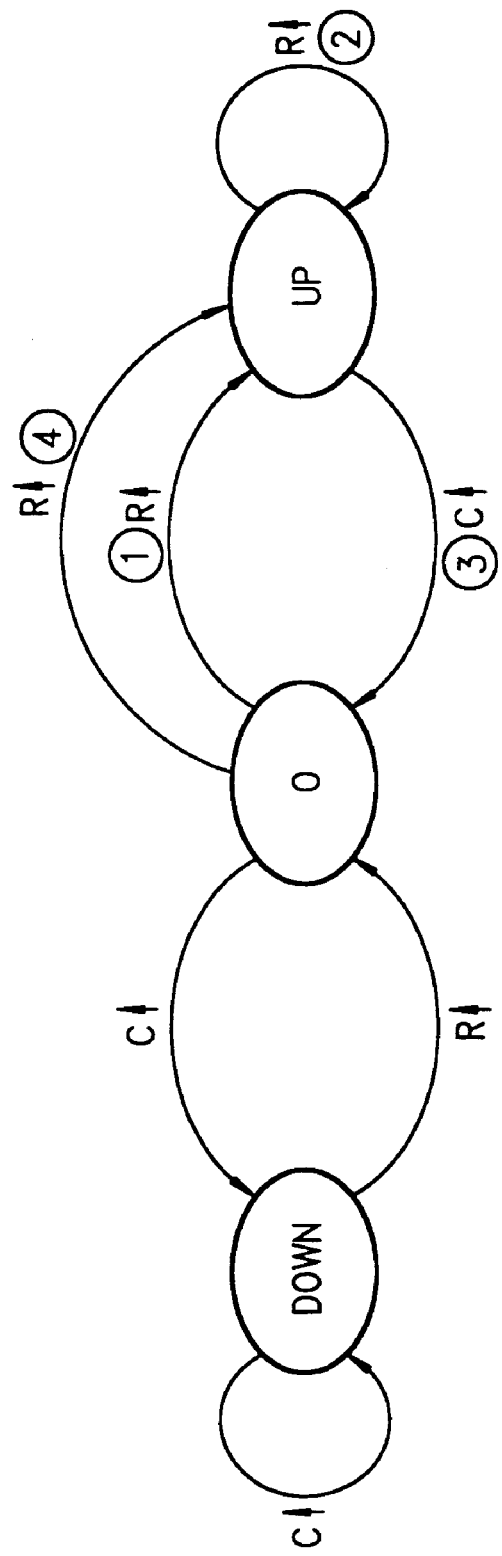
FIG. 9 shows a state diagram for a three-state phase frequency detector.

FIG. 8 shows timing diagrams for an example of the operation of a three-state phase frequency detector. FIG. 9 shows a state diagram for a three-state phase frequency detector. When entering an UP or DOWN state, the circuitry will generate an UP or DOWN pulse, respectively. When exiting or remaining in the UP or DOWN state, no pulse is generated.

For FIG. 8, assuming the circuitry starts in the 0 state, since the reference clock leads the clock at time 802, the circuitry goes to the UP state and generates a pulse. This is represented by the arrow labeled with a circled 1 in FIG. 9. At time 804, the reference clock leads the clock. The circuitry will remain in the UP state; no pulse is generated.

This is represented by the arrow labeled with a circled 2 in FIG. 9. At time 806, the clock leads the reference clock, so the circuitry resets or exits the UP state to return to the 0 state. No pulse is generated. This is represented by the arrow labeled with a circled 3 in FIG. 9. At time 808, the reference clock leads the clock, and the circuitry goes to the UP state. A pulse is generated. This is represented by the arrow labeled with a circled 4 in FIG. 9.

Figure 10:
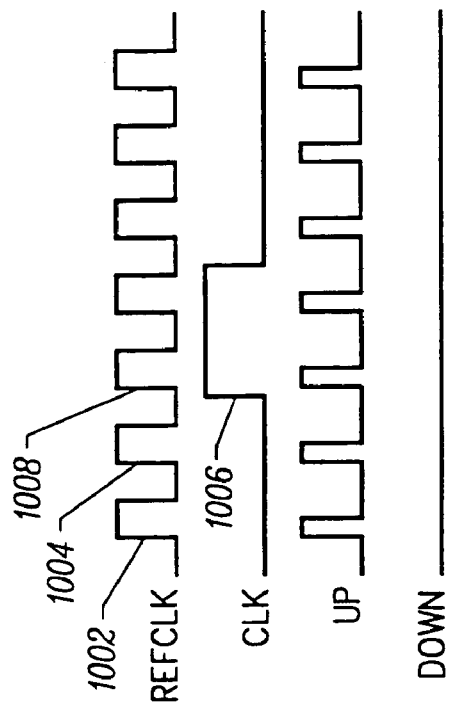
FIG. 10 shows a timing diagram for an m-state phase frequency detector.
Figure 11:
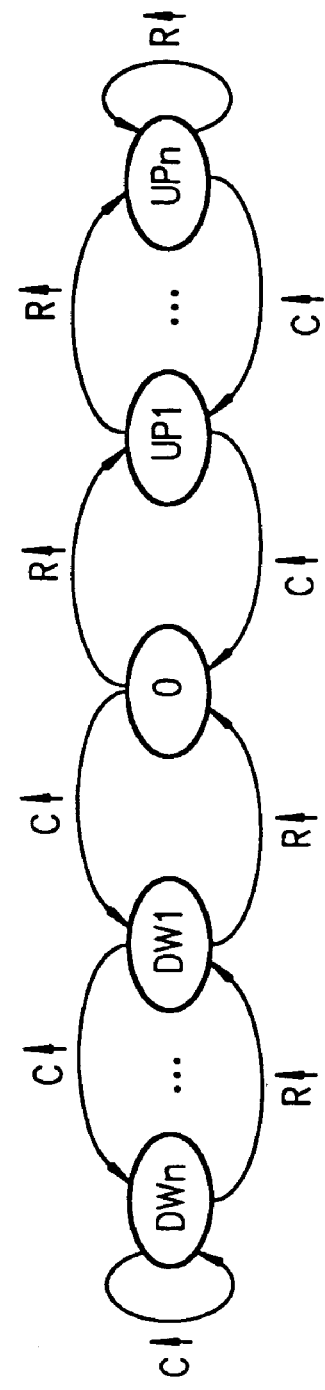
FIG. 11 shows a state diagram for an m-state phase frequency detector.

FIG. 10 shows a timing diagram for the same reference clock and clock inputs as FIG. 8, but the phase frequency detector has m states. FIG. 11 shows a state diagram for an m-state phase frequency detector. Although shown as operating based on rising clock edges, the circuitry could also be easily modified to operate based on falling clock edges. The phase detector is initially at state 0. It goes to state UP1 if the reference clock or REFCLK rising edge comes first. It returns to state 0 when the next rising edge is the VCO clock or CLK. If the next rising edge is CLK again, it goes to DW1 or DOWN1. Operation continues in this fashion moving from state to state as indicated in FIG. 11. For an m-state phase frequency detector, m is equal to 2*n+1.

The m-state phase frequency detector generates UP or DOWN pulses based on both the phase error and frequency difference of the two input clocks, REFCLK and CLK. If the frequency of REFCLK is several times faster than CLK, multiple UP pulses will be generated. If the frequency of the CLK is several times faster than the REFCLK, then multiple DOWN pulses will be generated. When it is in state 0, it generates no pulses. When in state UP1, it generates one up pulse. In state UPn, it generates m UP pulses, if the state machine stays at UPn, then no extra UP pulse is generated regardless of extra REFCLK rising edges. In state DOWN1, it generates one DOWN pulse. In state DOWNn, it generates n DOWN pulses. Similarly, if the state machine stays at DOWNn, then no extra down pulse is generated regardless of extra CLK rising edges.

For FIG. 10, the phase frequency detector receives and detects a string of rising edges of the reference clock before it sees a rising edge of the clock. A maximum of (m−1)/2 up pulses are generated, where m is the number of states. Assuming the circuitry starts in the 0 state, since the reference clock leads the clock at time 1002, the circuitry goes to the UP1 state and generates an UP pulse. At time 1004, the reference clock leads the clock. The circuitry will go to the UP2 state and generates another UP pulse. At time 1006, the clock leads the reference clock, so the circuitry resets or exits the UP2 state to return to the UP1 state. No pulse is generated. This is represented by the arrow labeled with a circled 3 in FIG. 11. At time 1008, the reference clock leads the clock, and the circuitry goes to the UP2 state. An UP pulse is generated. UP pulses continue to be generated as shown in FIG. 10 according to the state diagram of FIG. 11.

The three-state phase detector generates UP and DOWN pulses based on the phase delay between the two input clocks, reference clock and VCO clock (i.e., clock signal generated by the VCO). When the two clock frequencies are sufficiently or significantly different, the frequencies of the UP and DOWN pulses the phase detector generates will be determined by the slower of the two clock frequencies. This means the frequency of the UP and DOWN pulses will be at about the same frequency as the slower clock. In FIG. 8, the UP pulses were generated at about the frequency of the VCO clock signal. Compared to the m-state phase frequency detector of FIG. 10, a disadvantage of this phase detector implementation is that it has slow lock time when the VCO has wide frequency range, especially with low reference clock frequencies. Slow lock time refers to the time it takes for the circuitry receiving the up and down signals to "lock" on to the appropriate valve.

Therefore, the m-state phase and frequency detector of the invention can overcome the disadvantage of a three-state phase detector by generating UP and DOWN pulses that are determined by the faster clock input to the phase detector. The resulting phase and frequency detector will have more sensitivity to the frequency difference between the reference clock and VCO clock. Hence, it will have a faster lock time when the reference clock and VCO clock natural frequencies are sufficiently or significantly different. In FIG. 10, note the higher frequency at which UP pulses are generated as compared to that in FIG. 8.

Figure 12:
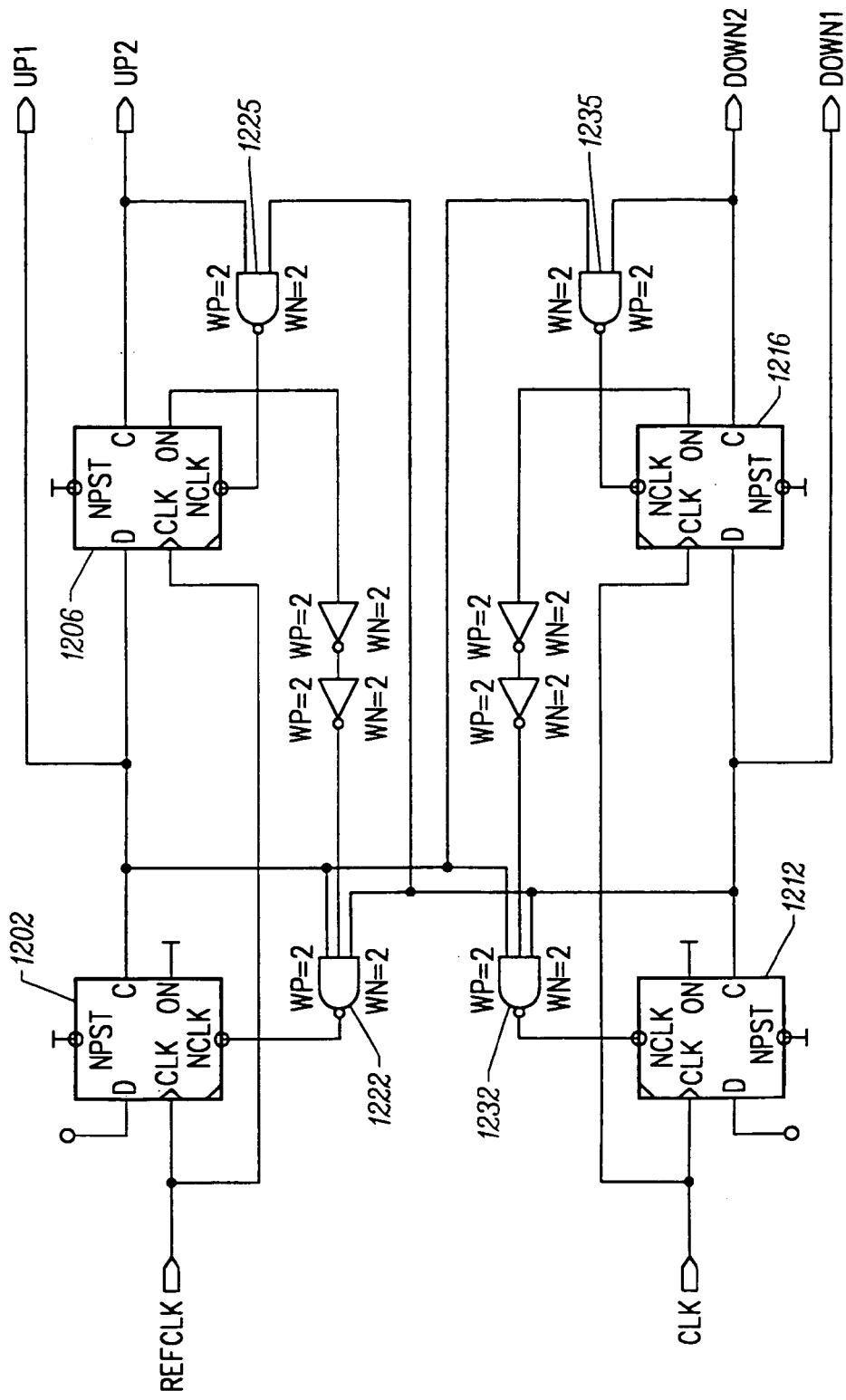
FIG. 12 shows a circuit diagram for a five-state phase frequency detector.
Figure 13:
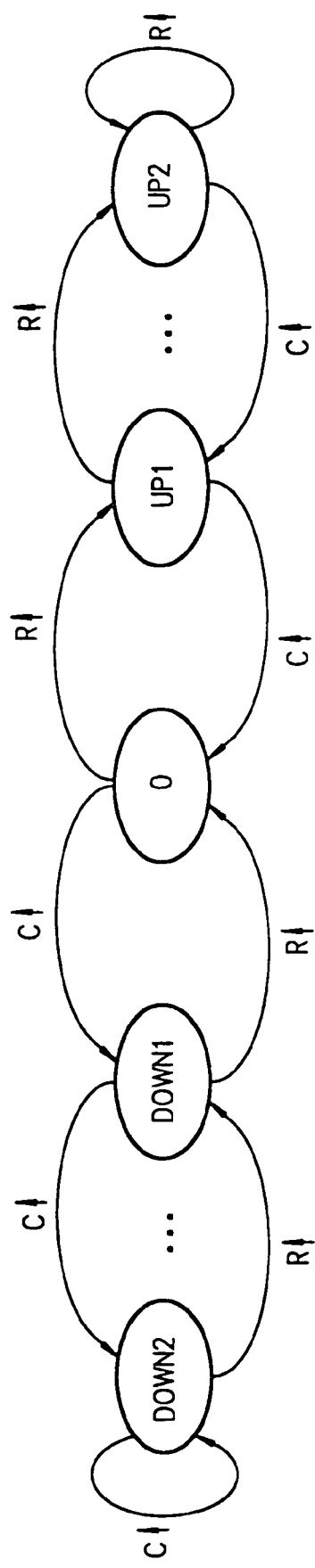
FIG. 13 shows a state diagram for a five-state phase frequency detector.

FIG. 12 shows a circuit implementation of a five-state phase frequency detector. FIG. 13 shows a state diagram for the operation of this detector circuit. The phase detector circuit of the invention may however have more than five states; for example, the circuitry may have seven, nine, eleven, thirteen, or more states. Similar circuitry and techniques may be used to implement a detector for m-states. There are two inputs, REFCLK and CLK. There are four outputs, UP1, UP2, DOWN1, and DOWN2. When the REFCLK rising edge occurs, UP1 goes high. UP2 goes high if the next clock rising edge is still REFCLK. UP2 will go low when the CLK rising edge comes, and so on. The pulse width of UP1, UP2, DOWN1, and DOWN2 can be limited to certain maximum widths using for example the XOR and delay block circuitry of FIG. 7.

REFCLK is connected to a clock input of a D-register 1202 and a D-register 1206. A D input of register 1202 is connected to VCC or VDD, which is a logic 1 input. A Q output of register 1202 outputs UP1. The Q output of register 1202 is connected to a D input of register 1206. A Q output of register 1206 outputs UP2.

CLK is connected to a clock input of a D-register 1212 and a D-register 1216. A D input of register 1212 is connected to VCC or VDD, which is a logic 1 input. A Q output of register 1212 outputs DOWN1. The Q output of register 1212 is connected to a D input of register 1216. A Q output of register 1216 outputs DOWN1.

Although the circuitry in this figure used D-type registers, other types of storage circuits and blocks may also be used. For example, instead of D-type registers, the circuitry may be implemented using latches and flip-flops including J-K, S-R, T, and other types of flip-flops. The D-registers in the circuit have an NPST input, an active low preset input. The NPST function is not used. Therefore, NPST inputs are connected to VCC or VDD to disable the function. Registers without an NPST input may also be used.

An output of NAND gate 1222 is connected to an NCLR input, an active low clear input, of register 1202. Inputs to NAND gate 1222 are UP1, a QN output (inverted Q, Q bar output, or /UP2) of register 1206, and DOWN1. The QN output from register 1206 is buffered and delayed using two inverters. The two inverters are used so that at the time register 1206 is reset, register 1202 is not reset. It is desirable that the registers are reset one at a time, so that registers 1206 and 1202 are not reset at the same time. This will enable proper operation of the state machine. An output of NAND gate 1225 is connected to an NCLR input of register 1206. Inputs to NAND gate 1225 are connected to UP2 and DOWN1. An output of NAND gate 1232 is connected to an NCLR input of register 1212. Inputs to NAND gate 1232 are UP1, a QN output (inverted Q, Q bar, or /DOWN2) of register 1216, and DOWN1. The QN output from register 1216 is buffered and delayed using two inverters. The two inverters are used so that at the time register 1216 is reset, register 1212 is not reset. It is desirable that the registers are reset one at a time, so that registers 1216 and 1212 are not reset at the same time. This will enable proper operation of the state machine. An output of NAND gate 1235 is connected to an NCLR input of register 1216. Inputs to NAND gate 1235 are connected to UP1 and DOWN2.

In this implementation, the logic gates are NAND gates. Other types of logic gates and logic elements may be used in other implementations of the invention. For example, NOR, AND, OR, pass gates, look-up tables, and other logical structures may also be used. A three-input NAND gate may be implemented using two two-input NAND gates.

The operation of the circuitry is shown by the state diagram of FIG. 13. Starting the initial or 0 state, the UP1, UP2, DOWN1, and DOWN2 outputs of FIG. 12 are 0. Upon a REFCLK edge, the circuit will enter the UP1 state, and the UP1 output becomes 1. While in the UP1 state, upon another REFCLK edge, the circuit will enter the UP2 state, and the UP2 output becomes 1 while the UP1 output becomes 0. While in the UP1 state, upon a CLK edge, the circuit will return to the 0 state. The UP1 and UP2 outputs will be reset to 0. When in the UP2 state, upon a CLK edge, the circuit will return to the UP1 state. The UP1 and UP2 outputs will be 0. When in the UP2 state, upon a REFCLK edge, the circuit will remain in the UP2 state. The UP1 and UP2 outputs will be 0.

When in the 0 state, upon a CLK edge, the circuit will go to DOWN1 state, and the DOWN1 output will be 1. When in the DOWN1 state, upon another CLK edge, the circuit will enter the DOWN2 state, and the DOWN2 output becomes 1 while the DOWN1 output becomes 0. While in the DOWN1 state, upon a REFCLK edge, the circuit will return to the 0 state. The DOWN1 and DOWN2 outputs will be reset to 0. When in the DOWN2 state, upon a REFCLK edge, the circuit will return to the DOWN1 state. The DOWN1 and DOWN2 outputs will be 0. When in the DOWN2 state, upon a CLK edge, the circuit will remain in the DOWN2 state. The DOWN1 and DOWN2 outputs will be 0.

The UP1 and UP2 outputs will typically be connected to an OR gate that outputs a unified or combined UP signal, which will pulse when either UP1 or UP2 pulses. Similarly, DOWN1 and DOWN2 outputs will typically be connected to an OR gate that outputs a unified or combined DOWN signal, which will pulse when either DOWN1 or DOWN2 pulses. Also, these outputs may be made to have a maximum or specific pulse width by using circuitry similar to what is shown in FIG. 7.

Figure 14:
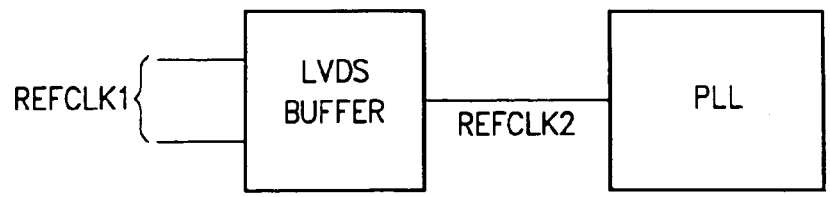
FIG. 14 shows a LVDS buffer and phase locked loop circuit.

FIG. 14 shows an embodiment of the invention where an LVDS buffer is coupled between a REFCLK1, provided using LVDS levels, and the PLL circuitry. The LVDS buffer converts the REFCLK1 to REFCLK2 which is a reference clock signal that is CMOS compatible. The LVDS buffer may include comparator circuitry to detect and compare its inputs.

LVDS is an emerging standard, and there is currently no single standard. In one implementation of LVDS, there are two input lines. A voltage difference between the two lines is about 200 millivolts, and a center voltage for the lines is about 1.2 volts. One logical state is represented by having 1.1 volts on the first line and 1.3 volts on the second line. The other logical state is represented by having 1.3 volts on the first line and 1.1 volts on the second line. Since LVDS has as a relatively small voltage swing, very high speed switching is permitted with less EMI noise.

The PLL circuit uses a CMOS-compatible clock input. So, the LVDS buffer converts the LVDS signal to CMOS compatible range. REFCLK2 will be in the range of 0 to VDD or VCC, which is typical of CMOS signals.

Figure 15:
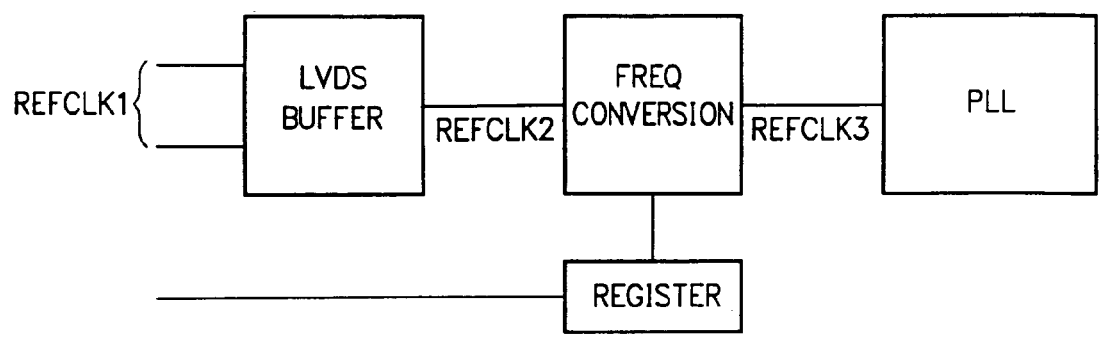
FIG. 15 shows a LVDS buffer, frequency conversion circuit, and phase locked loop circuit.

FIG. 15 shows the addition of a frequency conversion circuit to modify the frequency of the REFCLK1. Sometimes the LVDS clock signal is at a very high frequency that the PLL circuitry cannot handle directly. The frequency conversion circuit generates REFCLK3, which is at a reduced frequency. The amount to divide down the clock frequency can be selected by a value stored in a register. This value can be selected and input by the user in parallel or serial to the register.

Figure 16A:
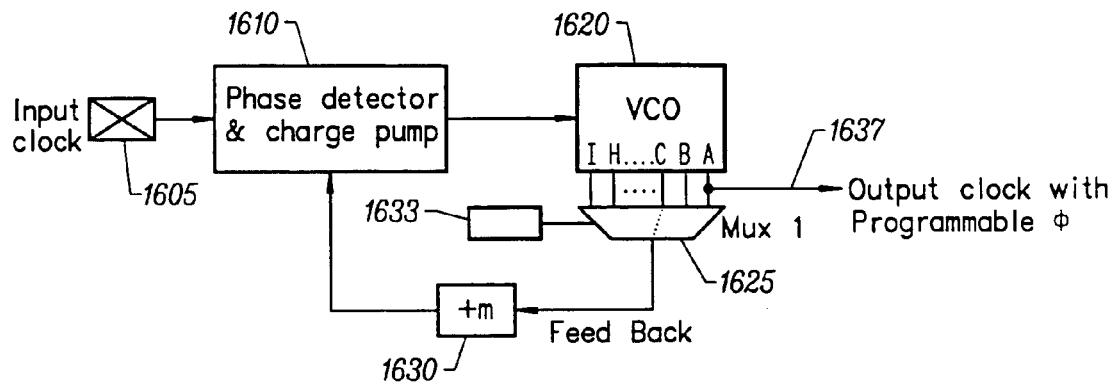
FIG. 16A shows a PLL circuit with a programmable phase shift feature.

FIG. 16A shows a PLL circuit with a programmable phase shift feature. This circuitry permits the user to programmably select a certain phase shift between the output clock and the input (or reference or external) clock. This feature provides flexibility for the user of integrated circuits, especially for programmable logic integrated circuits. For example, the user may programmably select from a 0 to 100 percent (e.g., 30 percent, 45 percent, 60 percent, 75 percent, 90 percent, or any other percentage) phase shift between the output clock and input clock.

Figure 17:
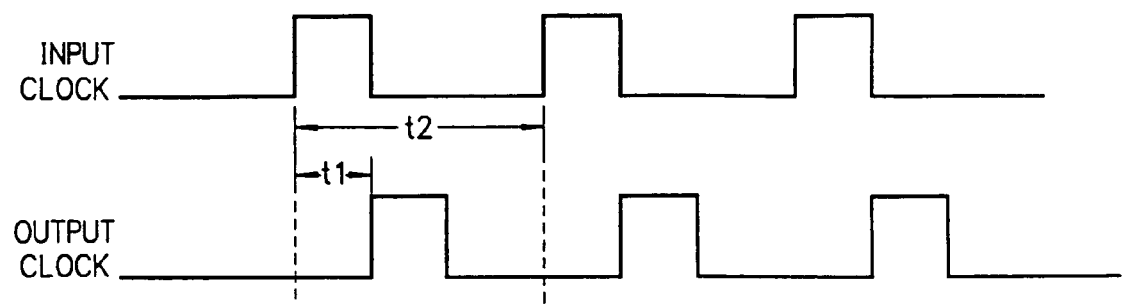
FIG. 17 shows a timing diagram of the input clock and output clock.

FIG. 17 shows a timing diagram of the input clock and output clock. The input clock and output clock may be at the same frequency or at different frequencies. The period of the input clock is t2. The time of the phase difference between the input clock and output clock is t1. The percentage of phase shift is given by (t1/t2)*100. In an embodiment of the invention, the amount of phase shift is programmably selectable.

Returning to FIG. 16A, the input or reference clock 1605 is connected to phase detector and charge pump circuitry 1610. The phase detector and charge pump are lumped into a single block for this figure. The m-state phase detector circuit discussed above may be used in circuitry 1610 to speed up the phase lock time. The charge pump is connected to the VCO 1620. The VCO includes a number of delay stages. Each of the delay stages will be connected to the charge pump. The delay stages are connected to a multiplexer 1625. In this embodiment, the VCO has outputs A through I. However, there can be any number of delay stages in the VCO. The output clock 1637 of the VCO is taken from stage A. If inverting delay stages are used, the number of stages should be odd in order to form an oscillator (for a single ended VCO implementation). The VCO, for example, may have any number of stages from 1 to 501 or more stages. In specific implementations, there are 3 stages, 5 stages, 7 stages, 9 stages, 15 stages, 65 stages, or 111 stages.

Figure 16B:
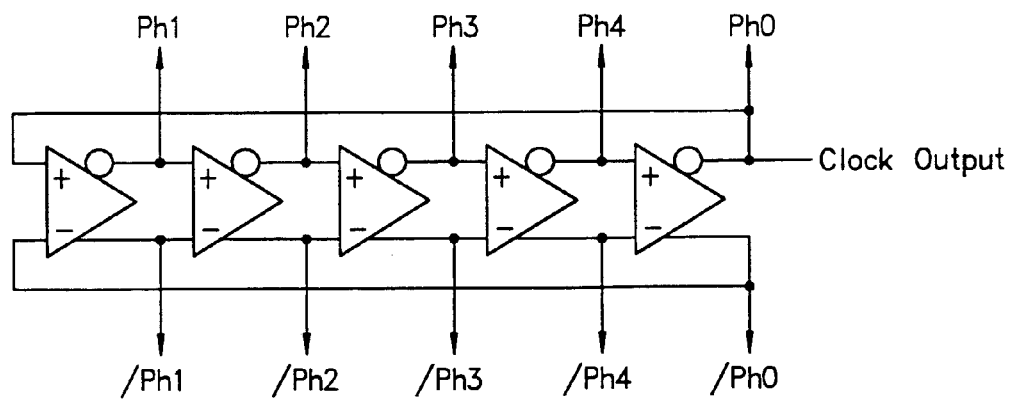
FIG. 16B shows a differential VCO circuit.

The specific number of VCO stages is dependent on the circuit implementation. The higher VCO frequency required, the smaller number of the VCO stages needed. Other types of VCO design are possible. An example is a differential stage VCO. The differential VCO can have even or odd numbers of stages, while the single-ended inverter string type of VCO can only have odd numbers of stages. If the differential VCO is used, both ends of the output can be connected to multiplexer 1625 to achieve finer resolution of programmable phase shift (without increasing the VCO stage numbers, which is a function of required frequency). In a specific embodiment, the programmable phase shift circuit uses a differential VCO. FIG. 16B shows an example of a differential VCO circuit. FIG. 16B is an example of the ring oscillator type of VCO using five differential stages. Notice that both ends of the output can be connected to multiplexer 1625. There are five stages and ten outputs.

Multiplexer 1625 programmably selects which of the delay stage outputs is fed back through the frequency divider 1630 to the phase detector. A configuration RAM 1633, programmable cells (e.g., EEPROM or Flash cells), register, latch, flip-flop, or other storage means may be used to control the programmable selection of the multiplexer. The storage means will hold the control bits. Depending on which of the delay stage outputs (e.g., A through I) is fed back, there will be a phase different between the input and output clocks. In one embodiment, the user inputs a number of bits into the configuration RAM. Based on these bits, the multiplexer will pass the VCO stage output corresponding to those bits to the phase detector.

The multiplexer selects one of the delay stages to feed back to the phase detector. For example, if there are 256 or fewer stages, then 8 control bits can be used to decode and select the appropriate output. The minimum number of control bits will be given by log2 n, where n is the number of stages. U.S. Pat. No. 5,815,024, which is incorporated by reference, shows various circuits and techniques of decoding multiple bits onto a single output, and any of these techniques may be used in the implementation of the multiplexer.

Figure 18:
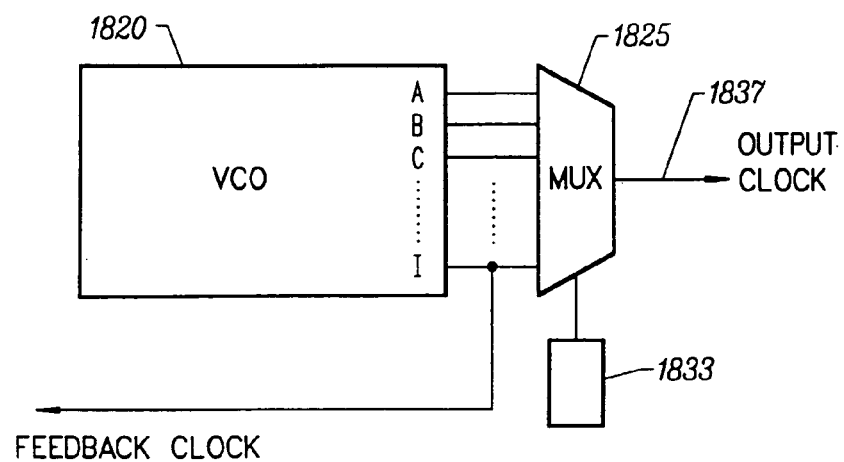
FIG. 18 shows another embodiment of a PLL circuit with a programmable phase shift feature.

The phase shift between input and output clocks is controlled by the phase difference between the delay stage output used for the output clock 1637 and the delay stage that is fed back to the phase detector. It should be noted the output clock may be taken from any of the delay stages. FIG. 16A shows a technique where the phase shift is selected by fixing the output clock at stage A, and programmably selecting which delay stage output to feed back. An alternative technique is to select the phase shift by fixing the delay stage output which is fed back, and then programmably selecting which delay stage output will be used as the output clock. An example of this alternative technique is that stage A is fed back, and a multiplexer like multiplexer 1625 is used to select which delay stage to use as the output clock. FIG. 18 shows an example of this embodiment. A multiplexer 1825 selects as an output clock 1837 one of the clock oscillator outputs from the VCO. A storage block 1833, analogous to 1633, holds the user's phase offset selection. One of the VCO outputs is fed back to the phase detector (not shown). In FIG. 18, output I is used as the feedback clock.

The phase shift can be adjusted with an amount of precision that is based on the number of stages in the VCO. Generally, the more delay stages, the finer the steps of phase shift will be available. If the output clock 1637 is stage A and the stage A output is also used as the feedback clock, there will be no phase shift between the input clock and the output clock. If there are j delay stages, each stage will provide an 1/j phase shift.

Figure 19:
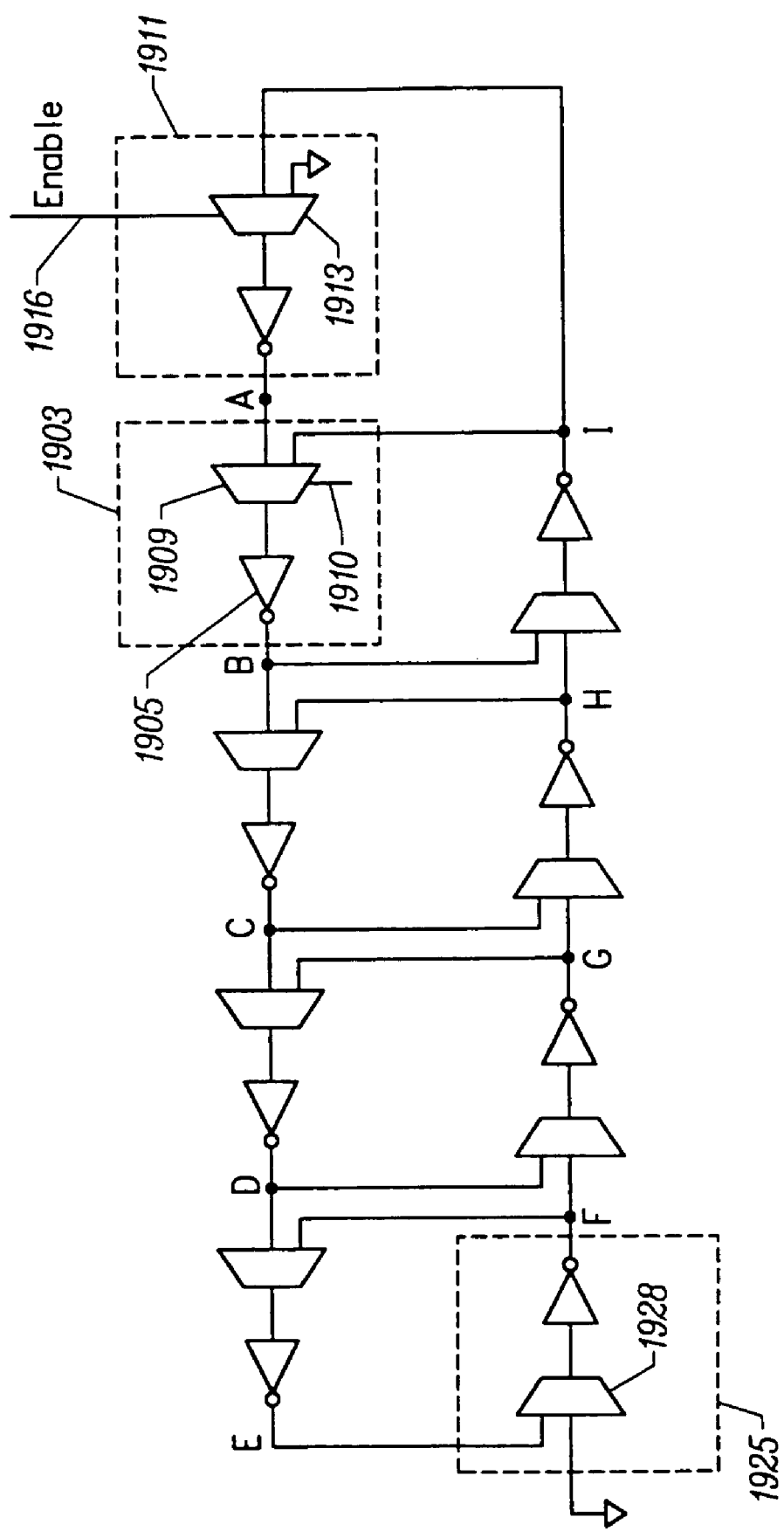
FIG. 19 shows a more detailed diagram of a VCO.

FIG. 19 shows a diagram of an embodiment of a voltage controlled oscillator, which may be used for VCO 1620 or 1820. Each stage or cell 1903 (between nodes A and B) includes a delay buffer 1905 and multiplexer 1909, which may be an inverting buffer. Multiplexer 1909 has an enable 1910 that controls whether the delay stage is enabled or disabled to increase or decrease the number of stages in the VCO. There is a delay stage between each of the nodes A through I. This embodiment has eight similar stages. The stages need not be identical or the same. However, in an embodiment of the invention, the stages are designed to be the same or as similar as possible in order to ensure a precise delay of each stage. A precise delay will improve the precision with which the phase adjustment can be programmably controlled. In an embodiment, the layout of the delay stages cell is the same or similar. For example, the device sizes of the transistors used to form the multiplexer and delay buffer will be the same. The interconnect lengths and widths between the stages will be the same.

In stage 1903, the multiplexer is connected to nodes A and I. The delay buffer outputs to node B. A stage 1911 is connected between nodes A and I. A multiplexer 1913 has an enable input 1916 that is used to enable or disable the VCO. When disabled, the VCO will not oscillate and power is conserved. Multiplexer 1913 is connected to node I and ground or VSS. In a stage 1925 connected between nodes E and F, a multiplexer 1928 is connected to node E and ground.

Figure 20:
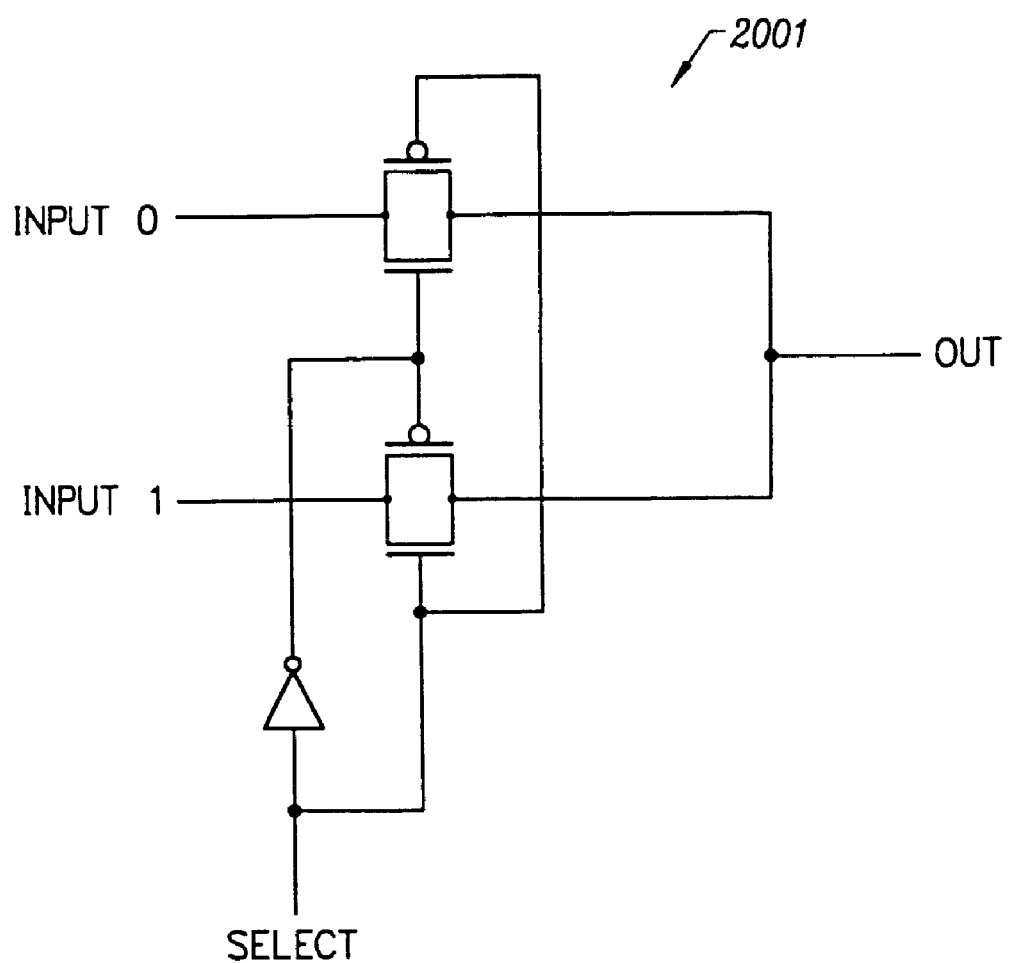
FIG. 20 shows a multiplexer circuit.

FIG. 20 shows a schematic for a multiplexer circuit 2001 which may be used in the implementation of the VCO in FIG. 19. The multiplexer has an INPUT 0, INPUT 1, SELECT input, and an OUT output. Based on SELECT, INPUT 0 or INPUT 1 will be passed to OUT. This multiplexer circuit is constructed using transmission gates or fully complementary CMOS pass gates. There are many other multiplexer circuit configurations that may be used in the VCO. For example, the multiplexer may be designed using logic gates like NAND, NOR, AND, OR, and INVERT.

Figure 21:
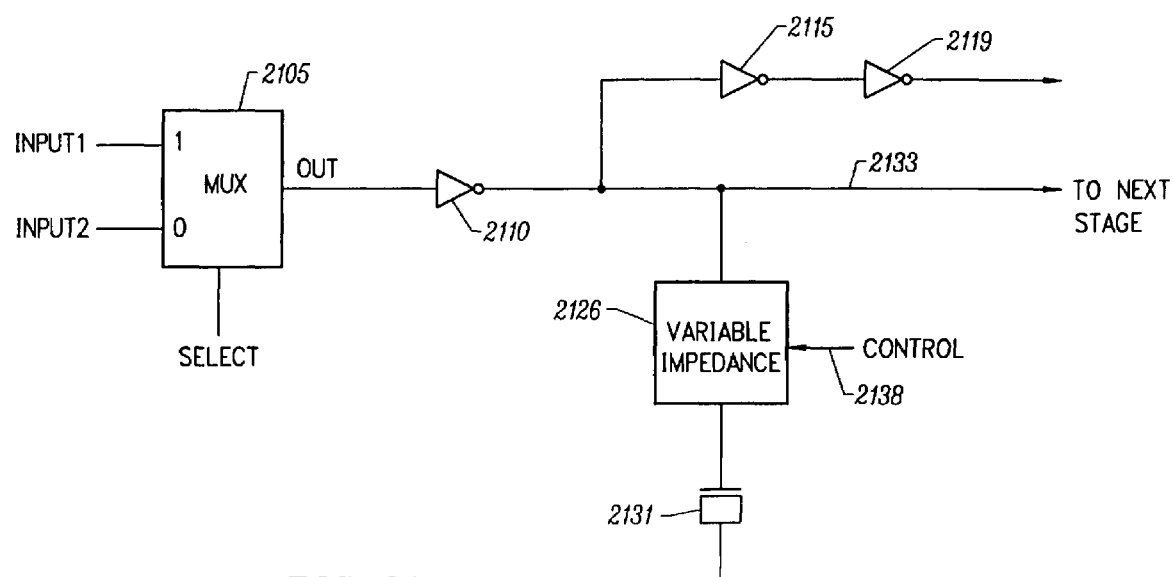
FIG. 21 shows an implementation of a delay stage.

FIG. 21 shows a more detailed diagram of a delay cell circuit that may be used in the VCO of FIG. 19. A multiplexer 2105 outputs into an inverter circuit 2110, which is in turn connected to two inverters 2115 and 2119 in sequence. An output of inverter 2119 is the delay stage's output, which will be connected to multiplexer 1625 to drive the feedback line. The inverters can be CMOS inverters or other types of implementations of an inverter. At an output of 2110 is a variable impedance 2126. The variable impedance is in series with a capacitance 2131 connected to ground. In the implementation in FIG. 21, capacitance 2131 is formed using a MOS transistors. However, any technique of creating a capacitance on an integrated circuit may be used to form capacitance 2131. Output 2133 is logically the same as the output of inverter 2119. Inverter 2119 is a big driver to handle more capacitive load, i.e., to drive multiplexer 1625 and the feedback line. The 2133 output is used "locally," i.e., to drive the next stage of the VCO.

Variable impedance 2126 provides a variable impedance at node 2133 based on control 2138. The impedance or resistance of variable impedance 2126 can be varied to give a resistance of variation with several orders of magnitude. For example, the variable impedance may be varied in one embodiment to have a value in a range from almost zero impedance to almost infinite impedance. By varying the impedance of variable impedance 2126 by way of control 2138, the amount of capacitance seen at node 2133 is varied. With greater capacitance at node 2133, there would be greater delay because there is a bigger capacitive load for inverter 2110 to drive. With less capacitance at node 2133, the delay would be less since there is less of a capacitive load for inverter 2110 to drive. Therefore, in a VCO with stages like that one in FIG. 21, by varying control 2138 of each stage, the frequency of the VCO is changed.

Figure 22:
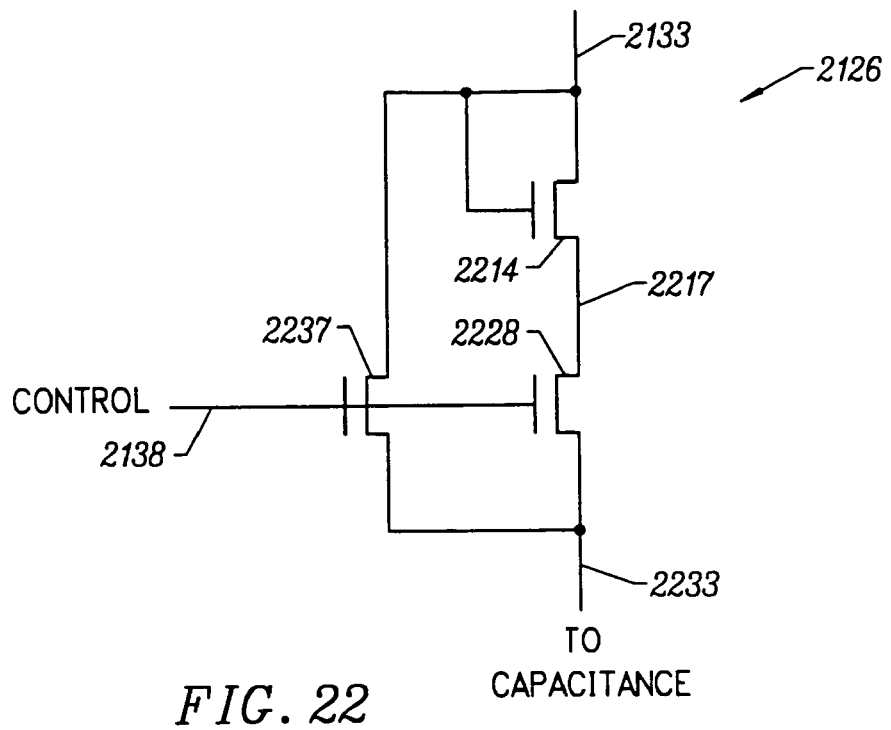
FIG. 22 shows a variable impedance circuit.

FIG. 22 shows an implementation of a variable impedance 2126. There are other techniques of creating a variable impedance and any of these techniques may be used. For example, a variable impedance may be created by using a single MOS transistor. In FIG. 22, a transistor 2214 is connected by node 2133 and a node 2217. A transistor 2228 is connected between nodes 2217 and 2233. A transistor 2237 is connected between nodes 2133 and 2233. In this implementation, the transistors are NMOS transistors. The variable impedance could also be been designed using PMOS transistor and other types of transistors and devices. Gates of transistors 2237 and 2228 are connected to control 2138, which is used to vary the impedance. Transistor 2214 is diode-connected, having its gate connected to node 2133 (its source). Node 2233 is connected to the capacitance or capacitor.

By varying a voltage at control 2138, the impedance between nodes 2133 and 2233 will also vary. The voltage at control 2138 typically ranges from VDD to VSS. When control is VSS, there will be essentially a very high impedance (which may be a tristate state), ignoring any leakage current, because transistors 2237 and 2228 are off. In a particular embodiment, the voltage at control 2138 varies from about zero volts to about 1.8 volts. Some advantages of the circuitry in FIG. 22 include that the voltage controlled resistor exhibits a relatively large range of resistance variation by a small control voltage change. There are also relatively few transistors used to implement the circuitry.

Figure 23:
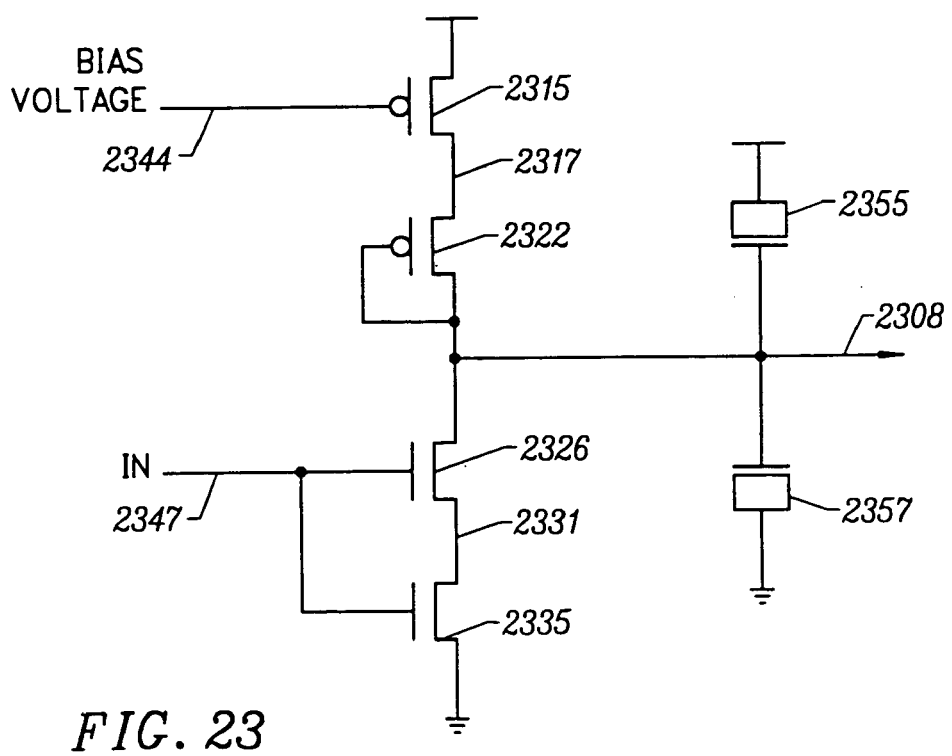
FIG. 23 shows a level shift circuit for generating a control voltage for the VCO.

FIG. 23 shows a level shift circuit to interface between the charge pump and the VCO control circuit. The charge pump output typically has an analog output that varies from about VT to about VDD-VT, where VT is a threshold voltage of a MOS transistor. In a specific embodiment, the level shift circuit of FIG. 23 shifts the charge pump output to a voltage range between about VSS and about VDD. In other words, the level shift circuit shifts the charge pump output to an appropriate voltage range that is more or most effective for the VCO control circuit. The level shifted charge pump control voltage is generated and provided at node 2308, which is in turn connected to node 2138. In the circuit, a transistor 2315 is connected between VDD and node 2317. A transistor 2322 is connected between 2317 and 2308. A transistor 2326 is connected between 2308 and 2331. A transistor 2335 is connected between 2331 and VDD. In this specific implementation, transistors 2315 and 2322 are PMOS while transistors 2326 and 2336 are NMOS. A gate of transistor 2315 is connected to a bias voltage 2344. Transistors 2322 is diode connected, where its gate is connected to node 2308. Gates of transistors 2326 and 2335 are connected to an IN input 2347. The voltage at IN varies, which varies the output voltage at 2308. Capacitances 2355 and 2357 are connected at node 2308. These capacitances help provide AC stabilization at node 2308 to fluctuations in the VDD and VSS voltages.

This detailed description of the invention has been presented for the purpose of illustration and description. It is not intended to be exhaustive or to limit the invention to the precise form described. Many modifications and variations are possible in light of this detailed description. The embodiments were chosen and described in order to best explain the principles of the invention and its practical applications. Others skilled in the art will recognize that various modifications can be made in order to best utilize and practice the invention for a particular application. The scope of the invention is defined by the following claims.

We claim:

1. A clock circuit for outputting a clock signal, the clock circuit comprising:
    a multiplexer having inputs coupled to first and second local signals of the clock circuit;
    a variable impedance circuit coupled to the multiplexer and the output clock signal of the clock circuit, and having an input coupled to a control signal of the clock circuit, wherein the control signal is indicative of a phase difference between a reference clock signal and a feedback clock signal; and
    a capacitance coupled to the variable impedance circuit.

2. The clock circuit of claim 1 further comprising at least one buffer circuit coupled between the variable impedance circuit and the output clock signal of the clock circuit.

3. The clock circuit of claim 1 further comprising at least one buffer circuit coupled between the multiplexer and the variable impedance circuit.

4. The clock circuit of claim 1 wherein the control signal is coupled to a phase detector circuit receiving the reference clock signal and the feedback clock signal.

5. The clock circuit of claim 1 wherein the impedance circuit comprises a first transistor whose gate is coupled to the control signal.

6. The clock circuit of claim 5 wherein:
    the impedance circuit further comprises a second transistor;
    the gate of the second transistor is coupled to the control signal; and
    the source of the second transistor is coupled to the source of the first transistor.

7. The clock circuit of claim 6 wherein:
    the impedance circuit further comprises a third transistor;
    the source of the third transistor is coupled to the drain of the second transistor; and
    the gate and drain of the third transistor are coupled to the drain of the first transistor.

8. A programmable logic device comprising the clock circuit of claim 1.

9. A processing unit comprising the programmable logic device of claim 8.

10. A method for generating an output clock signal, the method comprising:
    generating a signal indicative of a phase difference between a reference clock signal and a feedback clock signal;
    varying a control signal in response to receiving the signal indicative of the phase difference;
    selecting a first signal or a second signal to provide a third signal using a multiplexer;
    providing a delay to a fourth signal that is coupled to the third signal, wherein the delay is based on a capacitance;
    varying the capacitance in response to the varying the control signal by varying an impedance of a variable impedance circuit; and
    providing the output clock signal in response to providing the delay to the fourth signal.

11. The method of claim 10 wherein providing the output clock signal comprises:
    accepting the delayed fourth signal as an input to at least one buffer circuit; and
    generating the output clock signal from the at least one buffer circuit.

12. A method for generating at least one output clock signal, the method comprising:
    generating a signal indicative of a phase difference between a reference clock signal and a feedback clock signal using a phase detector;
    generating a control signal in response to receiving the signal indicative of the phase difference;
    varying a delay of a first local signal in response to receiving the control signal, wherein the varying comprises adjusting a first capacitance by varying an impedance of a first variable impedance circuit coupled to the first local signal;
    providing a first output clock signal in response to receiving the first local signal;
    varying a delay of a second local signal in response to receiving the control signal, wherein the varying comprises adjusting a second capacitance by varying an impedance of a second variable impedance circuit coupled to the second local signal;
    providing a second output clock signal in response to receiving the second local signal; and
    selecting from among the first and second output signals to provide the feedback clock signal.

* * * * *